(12) United States Patent
Tsuji et al.

(10) Patent No.: US 11,118,262 B2
(45) Date of Patent: Sep. 14, 2021

(54) SUBSTRATE PROCESSING APPARATUS HAVING A GAS-MIXING MANIFOLD

(71) Applicant: ASM IP Holding B.V., Almere (NL)

(72) Inventors: Naoto Tsuji, Tokyo (JP); Masaki Hirayama, Miyagi (JP)

(73) Assignee: ASM IP Holding B.V., Almere (NL)

(*) Notice: Subject to any disclaimer, the term of this patent is extended or adjusted under 35 U.S.C. 154(b) by 118 days.

(21) Appl. No.: 16/157,303

(22) Filed: Oct. 11, 2018

(65) Prior Publication Data

US 2020/0115797 A1    Apr. 16, 2020

(51) Int. Cl.
| | | |
|---|---|---|
| *C23C 16/455* | (2006.01) | |
| *B01F 5/02* | (2006.01) | |
| *H01J 37/32* | (2006.01) | |
| *B01F 3/02* | (2006.01) | |
| *C23C 16/50* | (2006.01) | |
| *B01F 5/00* | (2006.01) | |
| *B01F 15/00* | (2006.01) | |

(52) U.S. Cl.
CPC .......... *C23C 16/45512* (2013.01); *B01F 3/02* (2013.01); *B01F 5/0057* (2013.01); *B01F 5/0256* (2013.01); *C23C 16/45536* (2013.01); *C23C 16/45544* (2013.01); *C23C 16/45561* (2013.01); *C23C 16/45565* (2013.01); *C23C 16/50* (2013.01); *H01J 37/3244* (2013.01); *B01F 15/00915* (2013.01)

(58) Field of Classification Search
CPC combination set(s) only.
See application file for complete search history.

(56) References Cited

U.S. PATENT DOCUMENTS

| | | | | |
|---|---|---|---|---|
| 2003/0019428 A1* | 1/2003 | Ku | ..................... | C23C 16/45512 118/715 |
| 2004/0144311 A1* | 7/2004 | Chen | .................. | C23C 16/45512 118/715 |
| 2005/0270895 A1* | 12/2005 | Strang | ............... | C23C 16/45512 366/107 |
| 2008/0107809 A1* | 5/2008 | Wu | ................... | C23C 16/45512 118/715 |
| 2014/0269156 A1* | 9/2014 | Lane | ..................... | B01F 5/0689 366/177.1 |
| 2015/0240359 A1 | 8/2015 | Jdira et al. | | |
| 2016/0168705 A1* | 6/2016 | Lind | ................. | C23C 16/45565 239/413 |

* cited by examiner

*Primary Examiner* — Binu Thomas
(74) *Attorney, Agent, or Firm* — Studebaker & Brackett PC

(57) ABSTRACT

A substrate processing apparatus includes a chamber, a manifold including a tubular portion above the chamber, first and second introduction pipes provided on a side surface of the tubular portion, and a gas guide portion to guide, in a direction opposite the chamber, gases introduced from the first and second introduction pipes into the tubular portion, and then introduce the gases into the chamber. The gas guide portion does not contact a top of the manifold, and the manifold includes a space above the gas guide portion to allow the gases to flow from between the gas guide portion and the tubular portion into a space surrounded by the gas guide portion. The gas guide portion advantageously enables the gases to broadly diffuse and uniformly mix, increasing the quality of a film formed on a substrate inside the chamber.

14 Claims, 7 Drawing Sheets

SUBSTRATE PROCESSING APPARATUS HAVING A GAS-MIXING MANIFOLD

TECHNICAL FIELD

Examples are described which relate to a substrate processing apparatus.

BACKGROUND

There is a case where a manifold is provided on a chamber so as to intercommunicate with the internal space of the chamber. The manifold is configured so as to mix gases introduced from plural introduction pipes and then supply the mixed gas to the chamber. The mixed gas is used in, for example, film formation on a substrate, film etching, film reforming or the like in a chamber.

Various adverse effects may occur when mixing of gases is insufficient inside the manifold. For example, when a gas is supplied as a precursor to generate plasma, the concentration of the precursor introduced into a plasma space becomes non-uniform. The non-uniform precursor concentration deteriorates the distribution of the film thickness of a film formed on a substrate, or causes occurrence of particles in a gas phase.

SUMMARY

Some examples described herein may address the above-described problems. Some examples described herein may provide a substrate processing apparatus having a manifold capable of sufficiently mixing gases.

In some examples, a substrate processing apparatus includes a chamber, a manifold including a tubular portion provided above the chamber, a first introduction pipe provided on a side surface of the tubular portion, a second introduction pipe provided on the side surface of the tubular portion, and a gas guide portion configured to once guide, in a direction opposite to the chamber, gases introduced from the first introduction pipe and the second introduction pipe into the tubular portion, and then introduce the gases into the chamber, a first gas source configured to supply gas into the first introduction pipe, and a second gas source configured to supply gas into the second introduction pipe.

DETAILED DESCRIPTION

A substrate processing apparatus will be described with reference to the drawings. The same or corresponding constituent elements are represented by the same reference signs, and duplicative description thereof may be omitted.

Figure 1:
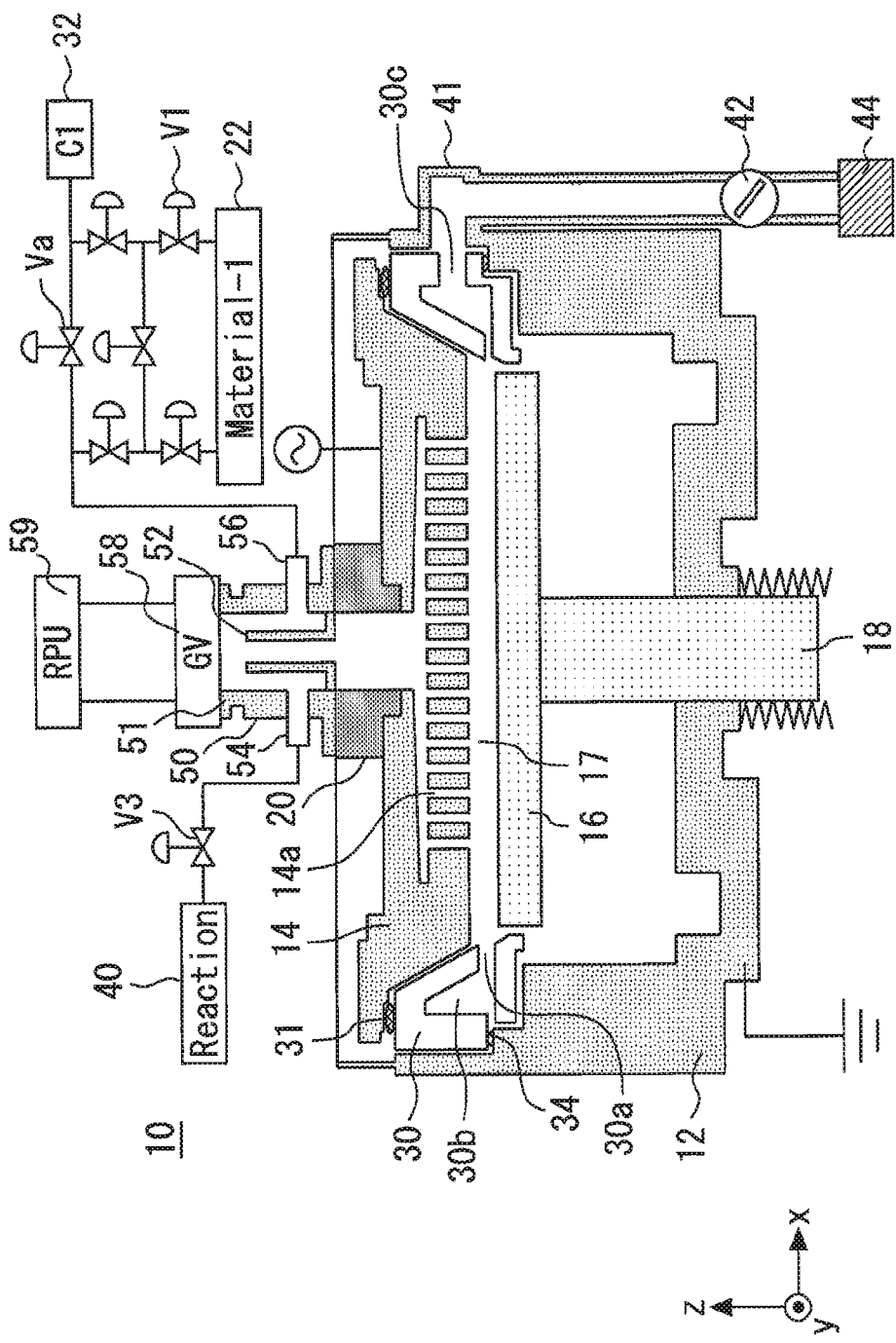
FIG. 1 is a cross-sectional view showing an example of the substrate processing apparatus.

FIG. 1 is a cross-sectional view showing a configuration example of the substrate processing apparatus. A substrate processing apparatus 10 is configured as, for example, a film forming apparatus for applying PEALD (Plasma Enhanced Atomic Layer Deposition) to a substrate. It is possible in the substrate processing apparatus 10 to perform not only ALD, but also CVD processing, film etching, and film reforming. The substrate processing apparatus 10 includes a chamber (Reactor Chamber) 12. A shower head 14 to which RF power is applied is provided in the chamber 12. The shower head 14 has one opening on the upper side thereof, and plural slits 14a on the lower side thereof.

A stage 16 facing the shower head 14 is provided in the chamber 12. The stage 16 is, for example, a susceptor supported by a sliding shaft 18. A parallel plate structure is formed by the shower head 14 and the stage 16. Since a space above the stage 16 is a space where processing such as film formation is performed on a substrate placed on the stage 16, the space is referred to as a processing space 17.

A manifold 50 is connected to the shower head 14 via an insulating part 20. The manifold 50 is a portion for mixing gases to be supplied between the shower head 14 and the stage 16. According to an example, the manifold 50 includes a tubular portion 51, a gas guide portion 52, a first introduction pipe 54, and a second introduction pipe 56. The tubular portion 51 is a portion which is provided above the chamber 12 and fixed to, for example, the insulating part 20. The tubular portion 51 can be screwed onto the insulating part 20, for example via an O-ring or not via an O-ring. The first introduction pipe 54 and the second introduction pipe 56 are provided on the side surface of the tubular portion 51. The first introduction pipe 54 and the second introduction pipe 56 are tubes that intercommunicate with the inside of the tubular portion 51.

The gas guide portion 52 is provided inside the tubular portion 51. The gas guide portion 52 once guides, in a direction opposite to the chamber 12, gas introduced from the first introduction pipe 54 and the second introduction pipe 56 into the tubular portion 51, and then introduces the gas into the chamber 12. In FIG. 1, the opposite direction of the chamber 12 corresponds to a z positive direction. That is, the gas guide portion 52 once guides the gas in the z positive direction, and then guides the gas in a z negative direction, thereby providing the gas into the chamber 12.

Figure 2:
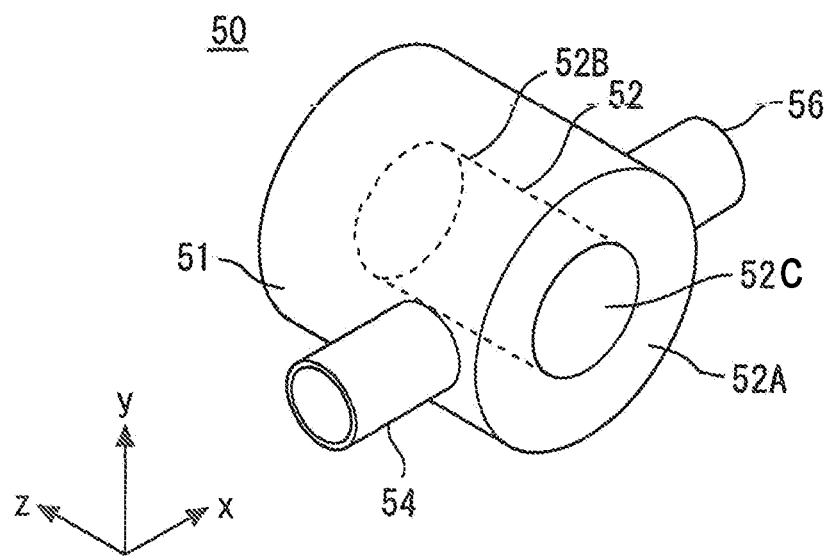
FIG. 2 is a perspective view showing an example of the manifold.

FIG. 2 is a perspective view showing a configuration example of the manifold 50. According to an example, the gas guide portion 52 includes a bottom plate portion 52A and an inner tube 52B. The bottom plate portion 52A is a plate which has an opening 52C at the center thereof and an outer edge in contact with the tubular portion 51. The inner tube 52B may be a cylinder whose bottom surface is in contact with the bottom plate portion 52A. By forming the inner tube 52B in a cylindrical shape, the side surface of the inner tube 52B is curved. By providing the gas guide portion 52 as described above, the internal space of the tubular portion 51 and the inside of the chamber 12 intercommunicate with each other through only the opening 52C.

Figure 3:
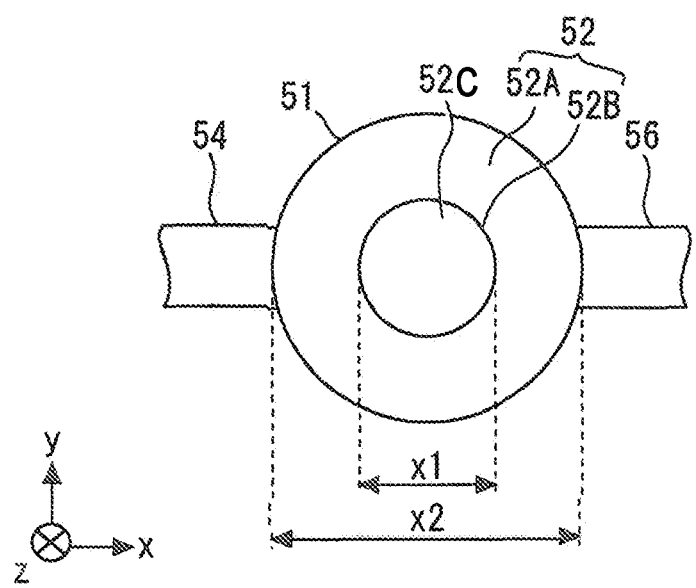
FIG. 3 is a bottom view showing an example of the manifold.

FIG. 3 is a bottom view showing a configuration example of the manifold 50. The diameter x1 of the inner tube 52B is equal to, for example, 50 mm, and the diameter x2 of the tubular portion 51 is equal to, for example, 100 mm. Other numerical values may be adopted. As shown in FIG. 3, the first introduction pipe 54 introduces a gas toward the center of the gas guide portion 52, and the second introduction pipe 56 introduces a gas toward the center of the gas guide portion 52 in a direction which is diametrically opposite to the gas introduction direction of the first introduction pipe 54. In other words, the first introduction pipe 54 introduces the gas into the tubular portion 51 in an x positive direction, and the second introduction pipe 56 introduces the gas into the tubular portion 51 in an x negative direction. In this example, the first introduction pipe 54 and the second introduction pipe 56 are aligned with each other on a straight line in plan view. Note that "plan view" means that an object is viewed in the z positive direction or the z negative direction.

Figure 4:
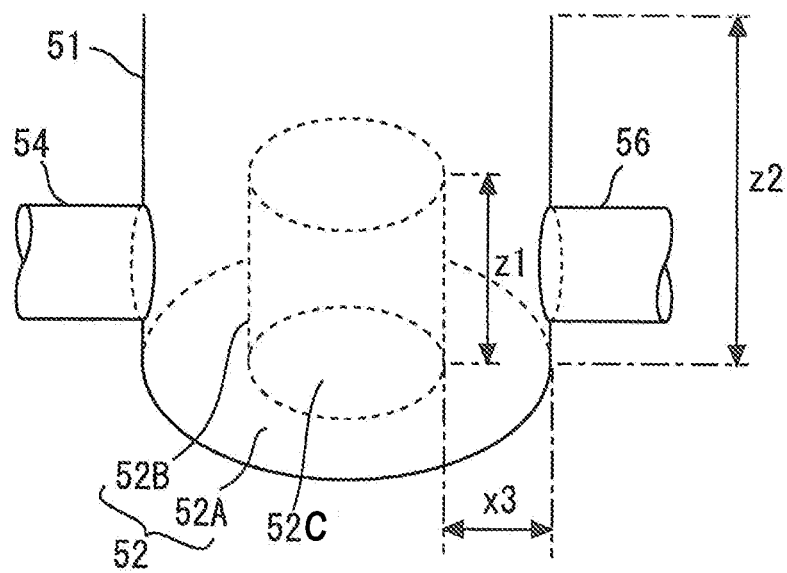
FIG. 4 is a perspective view showing an example of the manifold.

FIG. 4 is a perspective view showing a configuration example of the manifold 50. The height z1 of the inner tube 52B is set to, for example, 70 mm. The height z2 of the tubular portion 51 is set to, for example, 100 mm. The distance x3 between the inner tube 52B and the tubular portion 51 is set to, for example, 25 mm. In this case, the height (70 mm) of the inner tube 52B is equal to 2.8 times the distance (25 mm) between the inner tube 52B and the tubular portion 51. That is, z1/x3 is equal to 2.8. According to another example, z1/x3 may be set to 2.8 or more with different values from the foregoing values z1 and x3.

The height z1 of the inner tube 52 B may be set to 60 mm while the distance x3 between the inner tube 52 B and the tubular portion 51 is set to 25 mm. In this case, the height (60 mm) of the inner tube 52B is equal to 2.4 times the distance (25 mm) between the inner tube 52B and the tubular portion 51. That is, z1/x3 is equal to 2.4. According to another example, z1/x3 may be set to 2.4 or more with different values from the foregoing values z1 and x3. In another example, other numerical values may be taken.

Return to the description with respect to FIG. 1. A gate valve 58 is provided on the manifold 50. A remote plasma unit 59 is provided above the gate valve 58. The remote plasma unit 59 mainly generates plasma used for cleaning the chamber 12. Cleaning of the chamber 12 can be performed by providing plasma from the remote plasma unit 59 into the chamber 12 via the manifold 50 and the shower head 14 while the gate valve 58 is opened. The gate valve 58 is closed except during a period of the cleaning.

A first gas source 40 is connected to the first introduction pipe 54 via a valve V3. Any gas source for supplying a gas to the first introduction pipe 54 corresponds to the first gas source 40. A carrier gas source 32 is connected to the second introduction pipe 56 via a valve Va, and a second gas source 22 is connected to the second introduction pipe 56 via plural valves V1. For example, liquid material is stored in the second gas source 22, and the vapor of the liquid material is provided to the second introduction pipe 56 by the carrier gas provided from the carrier gas source 32. Any gas source for supplying a gas to the second introduction pipe 56 corresponds to the second gas source 22. The first gas source 40 and the second gas source 22 are allowed to serve as a gas source for any gas necessary to process the substrate. For example, they can be used as gas sources for BDEAS (Bis(diethylamino)silane), $O_2$, $SiI_4$, DCS (dichlorosilane), $NH_3$, TEOS or the like. The first gas source 40 and the second gas source 22 can provide gas necessary to form a nitride film such as SiN. The first gas source 40 and the second gas source 22 may be used as any gas sources which provide different gases.

An exhaust duct 30 is provided between the shower head 14 and the chamber 12. The exhaust duct 30 is formed of, for example, ceramic material. An appropriately compressed O-ring 31 may be provided between the exhaust duct 30 and the shower head 14. An appropriately compressed O-ring 34 may be provided between the exhaust duct 30 and the chamber 12.

The exhaust duct 30 is formed in an annular shape in plan view so as to surround the stage 16. An annular channel 30b which surrounds the processing space 17 above the stage 16 is provided by the exhaust duct 30. In the exhaust duct 30, an annular slit 30a through which a gas supplied to the processing space 17 is guided to the annular channel 30b, and an exhaust port 30c for discharging the gas in the annular channel 30b to the outside are provided.

The exhaust port 30c is connected to a gas exhaust portion 41 provided on the side surface of the chamber 12. The gas exhaust portion 41 is provided to exhaust the used gas. A valve 42 and a vacuum pump 44 are connected to the gas exhaust portion 41. The pressure in the chamber 12 can be freely controlled by adjusting the discharged amount with the valve 42 and the vacuum pump 44.

Figure 5:
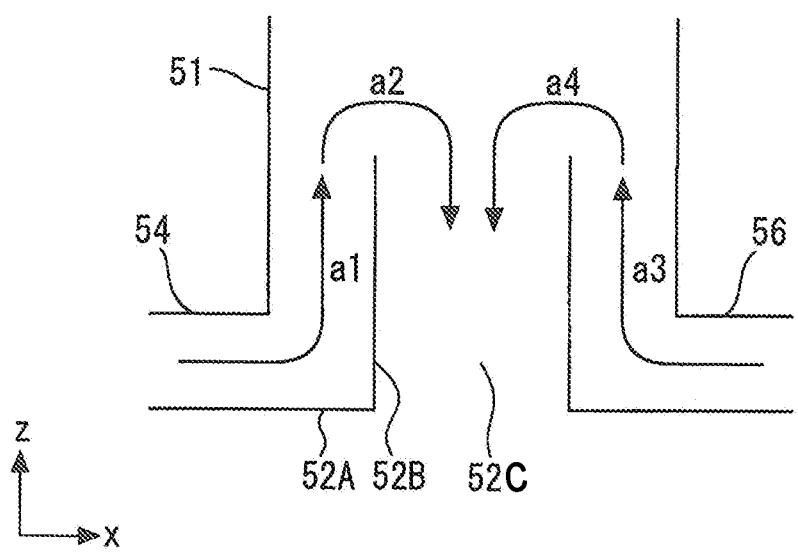
FIG. 5 is a cross-sectional view exemplifying the flow of gases.

Next, an operation example of the substrate processing apparatus 10 will be described. FIG. 5 is a cross-sectional view exemplifying the flow of gases in the manifold 50. A first gas provided from the first introduction pipe 54 into the tubular portion 51 impinges against the inner tube 52B, and is guided in the z positive direction which is opposite to the direction to the chamber as indicated by an arrow a1. Thereafter, the flow of the first gas in the z positive direction weakens, and the first gas advances in the z negative direction through the inner tube 52B as indicated by an arrow a2. On the other hand, a second gas provided from the second introduction pipe 56 into the tubular portion 51 impinges against the inner tube 52B, and is guided in the z positive direction which is opposite to the direction to the chamber as indicated by an arrow a3. Thereafter, the flow of the second gas in the z positive direction weakens, and the second gas advances in the z negative direction through the inner tube 52 B as indicated by an arrow a4. As the first gas and the second gas advance as indicated by the arrows a1, a2, a3, and a4, the first gas and the second gas broadly diffuse on an xy plane, and are sufficiently mixed with each other.

The gas supplied from the manifold 50 as described above is supplied into the processing space 17 through the slits 14a of the shower head 14 shown in FIG. 1. That is, the gas provided from the manifold 50 is guided onto the substrate by the shower head 14. Plasma of the gas is generated by the electric field between the shower head 14 and the stage 16 to which power is applied, and the substrate on the stage 16 is subjected to a plasma treatment. The gas used for the plasma treatment radially spreads in plan view, passes through the slits 30a of the exhaust duct 30 and enters the annular channel 30b, and is discharged to the outside from the exhaust port 30c.

According to this operation example, since the first gas and the second gas are sufficiently mixed with each other in the manifold 50, for example, the precursor concentration can be made more uniform. As a result, for example, the distribution of the film thickness of a film formed on the substrate can be improved.

Figure 6:
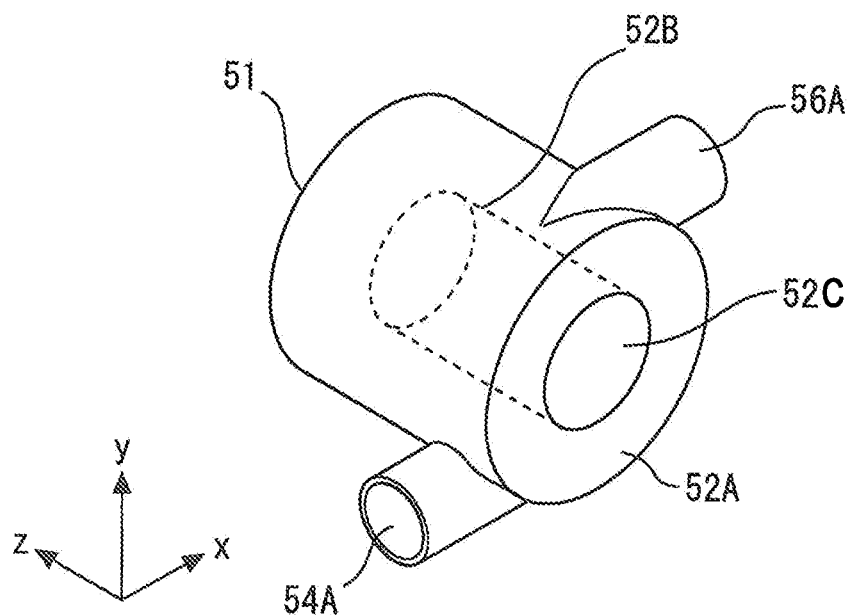
FIG. 6 is a perspective view showing another example of the manifold.

FIG. 6 is a perspective view showing another configuration example of the manifold. The first introduction pipe 54A and the second introduction pipe 56A introduce gases in directions deviated from the center of the gas guide portion 52. According to an example, when viewed from the z negative direction, the first introduction pipe 54A provides the gas to a position at which the value of the y-coordinate is smaller than that at the center of the gas guide portion 52, and the second introduction pipe 56A provides the gas to a position where the value of the y-coordinate is larger than that at the center of the gas guide portion 52. For example, the first introduction pipe 54A and the second introduction pipe 56A may be provided in parallel to each other with the center of the gas guide portion 52 interposed therebetween in plan view.

Figure 7:
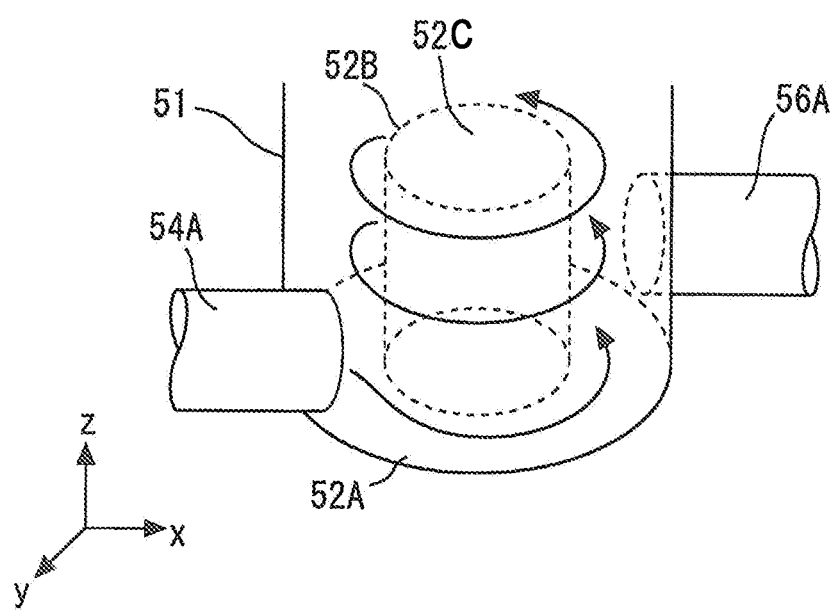
FIG. 7 shows the flow of gases inside the manifold.

FIG. 7 is a perspective view showing the flow of gases inside the manifold of FIG. 6. By providing the first introduction pipe 54A and the second introduction pipe 56A as described above, it is possible to generate a vortex indicated by arrows between the gas guide portion 52 and the tubular portion 51. This vortex promotes mixing of the first gas and the second gas.

Figure 8:
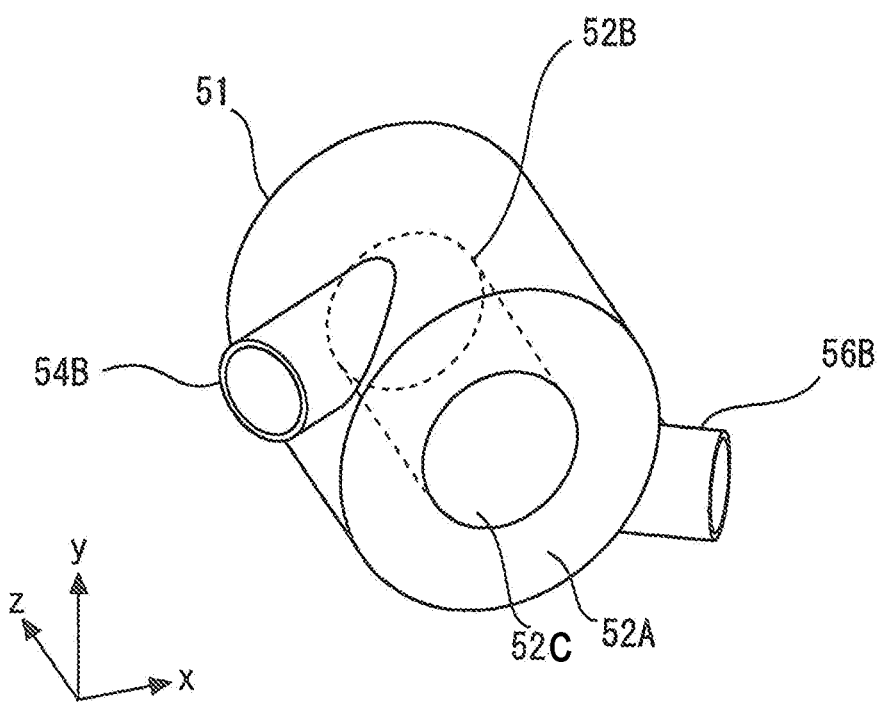
FIG. 8 is a perspective view showing another example of the manifold.

FIG. 8 is a perspective view showing another configuration example of the manifold. The manifold in FIG. 8 is similar to the manifold in FIG. 6, but differs from the manifold in FIG. 6 in that the first introduction pipe 54B and the second introduction pipe 56B are farther away from the chamber 12 as they are closer to the tubular portion 51. That is, the z-coordinates of the first introduction pipe 54B and the second introduction pipe 56B become larger as they are closer to the tubular portion 51. In other words, the first introduction pipe 54B and the second introduction pipe 56B are inclined downward with respect to the normal line of the side wall of the tubular portion 51. Such an inclination increases the speed of the vortex generated in the tubular portion 51 by the first gas and the second gas, so that the mixing of the first gas and the second gas is further promoted.

Figure 9:
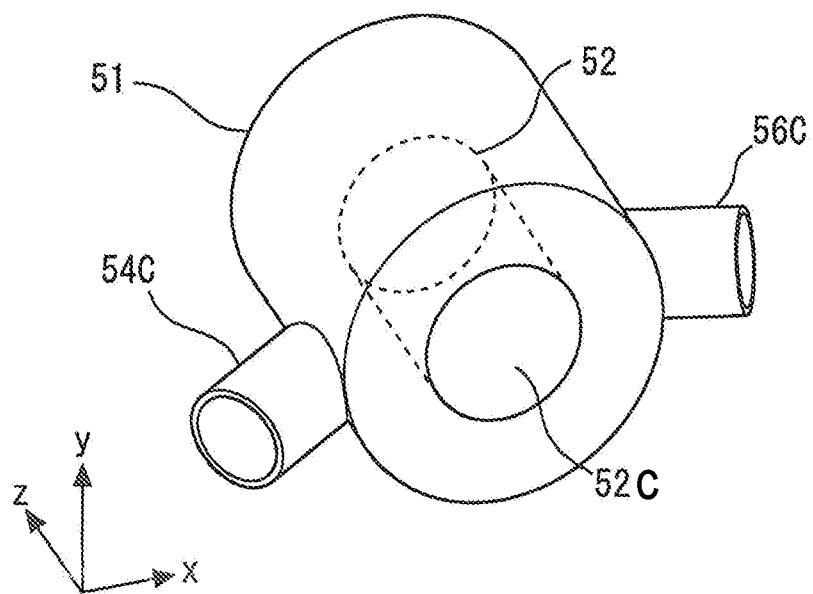
FIG. 9 is a perspective view of another example of the manifold.

FIG. 9 is a perspective view of another configuration example of the manifold. The manifold in FIG. 9 is similar to the manifold in FIG. 2, but differs from the manifold in FIG. 2 in that a first introduction pipe 54C and a second introduction pipe 56C are farther away from the chamber 12 as they are closer to the tubular portion 51. With this configuration, the first gas and the second gas vigorously advance in a direction away from the chamber 12 in the tubular portion 51, so that the mixing of the first gas and the second gas is promoted.

Figure 10:
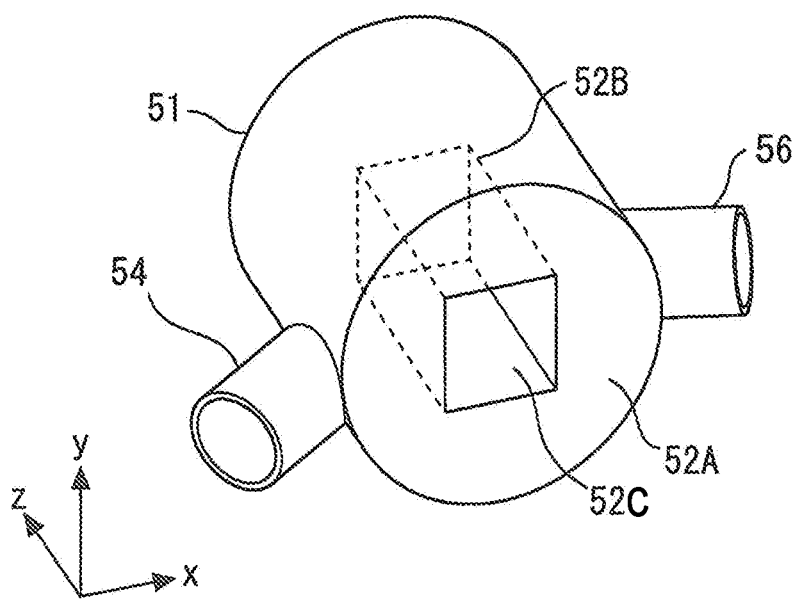
FIG. 10 is a perspective view showing another example of the manifold.

FIG. 10 is a perspective view showing another configuration example of the manifold. The side surface of the inner tube 52B is formed as a flat surface. The inner tube 52B has, for example, four flat surfaces as the side surface. The number of flat surfaces constituting the side surface may be set to 3 or to 5 or more.

Figure 11:
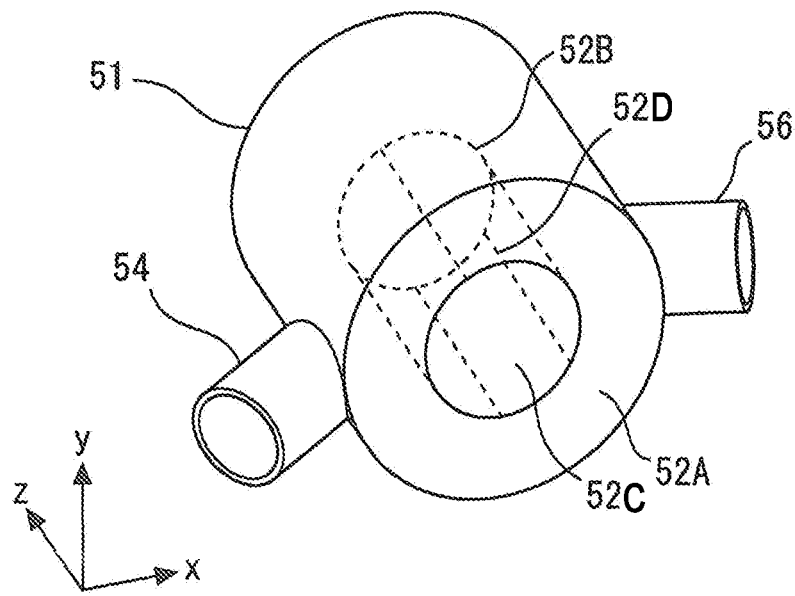
FIG. 11 is a perspective view of another example of the manifold.

FIG. 11 is a perspective view of another configuration example of the manifold. Slits 52D extending in the z direction are formed on the side surface of the inner tube 52B. The number of the slits 52D is not limited to a specific number.

Figure 12:
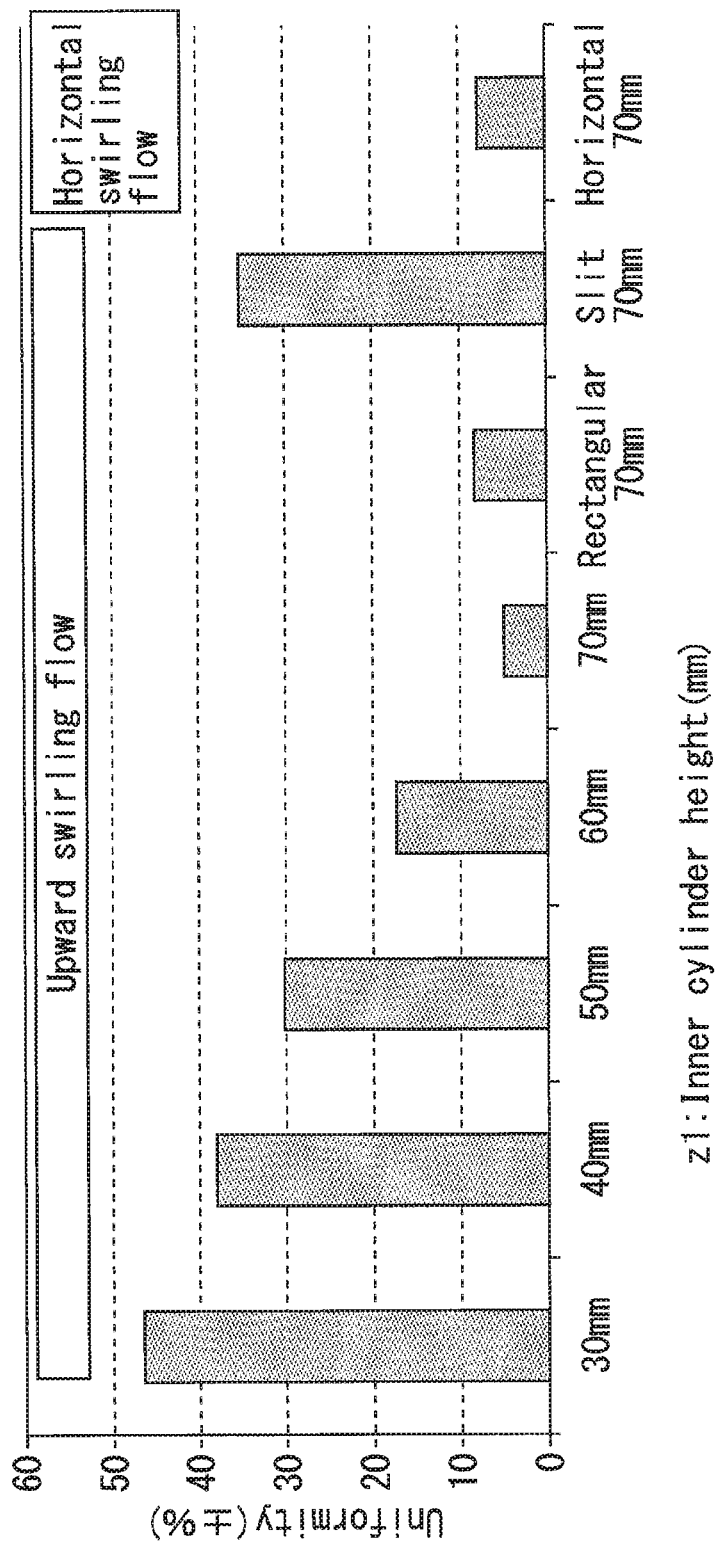
FIG. 12 is a diagram showing the uniformity of the gas provided from each manifold.

FIG. 12 is a diagram showing the relationship between the type of the manifold and the uniformity of the gas provided from the manifold. The ordinate axis represents the uniformity of gas at the opening 52C which is the outlet of the manifold. It can be said that the ordinate axis represents how much the gas concentration at each place of the opening 52C varies. The uniformity of gas is higher as the value of Uniformity is smaller.

The uniformity of gas was measured for a total of eight manifolds. Seven results on the left side were obtained by using the manifold having the first introduction pipe 54B and the second introduction pipe 56B shown in FIG. 8. One result at the right end was obtained by using the manifold having the first introduction pipe 54A and the second introduction pipe 56A shown in FIG. 6. The numerical values shown on the abscissa axis represent the height z1 of the inner tube 52B. Five pieces of data on the left side were obtained by using the cylindrical inner tube 52B shown in FIG. 2. The data indicated as "Rectangular" was obtained by using the inner tube 52B of FIG. 10. The data indicated as "Slit" was obtained by using the inner tube 52B of FIG. 11. The distance x3 between the inner tube 52B and the tubular portion 51 was equal to 25 mm except for the data indicated as "Rectangular".

For example, the data indicated as "60 mm" at the fourth from the left end was obtained by using the manifold having the distance x3 of 25 mm and the height z1 of 60 mm. Also, the data indicated as "70 mm" at the fifth from the left end was obtained by using the manifold having the distance x3 of 25 mm and the height z1 of 70 mm. Diffusion of the gas is promoted or suppressed depending on the ratio of x3 and z1.

Each data of FIG. 12 was obtained under the condition that $O_2$ and $N_2$ were introduced at the flow rate of $1 \times 10^{-4}$ kg/s from the first introduction pipe and the second introduction pipe into the tubular portion 51 respectively, the pressure in the manifold was set to 400 Pa, and the temperature of the manifold was set to 80° C.

From the data in FIG. 12, it has been found that as the height z1 of the inner tube 52B is higher, the uniformity of gas can be more enhanced. Particularly, setting of z1 to 60 mm or more or 70 mm or more gives an effect of remarkably improving the uniformity. It is apparent that formation of vortices in the manifold is particularly effective because both the data indicated as "70 mm" give sufficiently small uniformity.

As described above, it is possible to provide a gas with excellent uniformity by configuring the lower portion of the manifold in a double-pipe structure, once guiding the gas upwards and then causing the gas to flow downwards from a hole at the center. Various methods are possible for connection of the gas introduction pipes.

The invention claimed is:
1. A substrate processing apparatus comprising:
    a chamber;
    a manifold including a tubular portion provided above the chamber, a first introduction pipe provided on a side surface of the tubular portion, a second introduction pipe provided on the side surface of the tubular portion, and a gas guide portion configured to guide, in a direction opposite to the chamber, gases introduced from the first introduction pipe and the second introduction pipe into the tubular portion, and then introduce the gases into the chamber, the gas guide portion including a bottom plate portion having an opening at a center thereof and having an outer edge in contact with the tubular portion, and an inner tube having a bottom surface in contact with the bottom plate portion;
    a first gas source configured to supply gas into the first introduction pipe;
    a second gas source configured to supply gas into the second introduction pipe; and
    a gate valve above the manifold, the gate valve configured to open and close a space above the bottom plate portion and the inner tube, wherein the manifold includes a space disposed immediately above the gas guide portion such that the gases flow from between the gas guide portion and the tubular portion into a space surrounded by the gas guide portion, and the gas guide portion does not contact a top of the manifold.

2. The substrate processing apparatus according to claim 1, further comprising a stage provided in the chamber, and a shower head provided in the chamber and configured to guide the gas provided from the manifold onto the stage.

3. The substrate processing apparatus according to claim 1, wherein the first introduction pipe is configured to introduce gas to a center of the gas guide portion, and the second introduction pipe is configured to introduce gas to the center of the gas guide portion in a direction diametrically opposite to a gas introduction direction of the first introduction pipe.

4. The substrate processing apparatus according to claim 3, wherein the first introduction pipe and the second introduction pipe are aligned with each other on a straight line in plan view.

5. The substrate processing apparatus according to claim 1, wherein the first introduction pipe and the second introduction pipe introduce gas in a direction deviated from a center of the gas guide portion to generate a vortex between the gas guide portion and the tubular portion.

6. The substrate processing apparatus according to claim 5, wherein the first introduction pipe and the second introduction pipe are parallel to each other with the center of the gas guide portion interposed therebetween in plan view.

7. The substrate processing apparatus according to claim 1, wherein the first introduction pipe and the second introduction pipe are farther away from the chamber as the first introduction pipe and the second introduction pipe are closer to the tubular portion.

8. The substrate processing apparatus according to claim 1, wherein a height of the inner tube is not less than 2.4 times a distance between the inner tube and the tubular portion.

9. The substrate processing apparatus according to claim 1, wherein a height of the inner tube is not less than 2.8 times the distance between the inner tube and the tubular portion.

10. The substrate processing apparatus according to claim 1, wherein the inner tube is configured in a cylindrical shape.

11. The substrate processing apparatus according to claim 1, wherein a side surface of the inner tube is a curved surface.

12. The substrate processing apparatus according to claim 3, wherein a side surface of the inner tube is a flat surface.

13. The substrate processing apparatus according to claim 1, wherein the first gas source and the second gas source are configured to provide different gases.

14. The substrate processing apparatus according to claim 1, wherein the gas guide portion has a side wall, and the side wall does not include a through-hole.

* * * * *